United States Patent
Hu et al.

(10) Patent No.: US 7,538,620 B1
(45) Date of Patent: May 26, 2009

(54) PHASE LOCK CONTROL SYSTEM FOR A VOLTAGE CONTROLLED OSCILLATOR

(75) Inventors: Zhiqun Hu, Liberty Township, OH (US); David Christopher Danielsons, Maineville, OH (US)

(73) Assignee: Harris Corporation, Melbourne, FL (US)

( * ) Notice: Subject to any disclaimer, the term of this patent is extended or adjusted under 35 U.S.C. 154(b) by 42 days.

(21) Appl. No.: 11/985,005

(22) Filed: Nov. 13, 2007

(51) Int. Cl.
*H03L 7/06* (2006.01)

(52) U.S. Cl. ............... 331/14; 331/17; 331/18; 455/260

(58) Field of Classification Search ............ 331/1 A, 331/14, 17, 18, 25; 455/260
See application file for complete search history.

(56) References Cited

U.S. PATENT DOCUMENTS

| | | |
|---|---|---|
| 4,541,105 A | 9/1985 | Lee et al. |
| 5,465,277 A * | 11/1995 | Schreurs et al. ............ 375/376 |
| 5,861,842 A | 1/1999 | Hitch et al. |
| 5,896,180 A | 4/1999 | Usui |
| 2002/0080901 A1 | 6/2002 | Ham |
| 2007/0035345 A1 | 2/2007 | Siddall |

FOREIGN PATENT DOCUMENTS

EP 0 595 013 A 5/1994

OTHER PUBLICATIONS

International Search Report - 3 pgs., Feb. 4, 2009, Harris Corporation.
PCT Written Opinion of the International Search Report - 5 pgs., Feb. 4, 2009, Harris Corporation.

* cited by examiner

*Primary Examiner*—David Mis
(74) *Attorney, Agent, or Firm*—Tarolli, Sundheim, Covell & Tummino LLP

(57) ABSTRACT

A phase lock control system is presented for controlling a voltage controlled oscillator. The system includes a voltage controlled oscillator that produces a frequency signal exhibiting an output frequency that varies dependent upon the value of a control voltage applied thereto. A frequency deviation determining system employs a counter intermittently triggered ON for a fixed time by successive timing pulses received from a reference source and a comparator that determines any frequency deviation of the output frequency relative to a preset frequency. An error filter monitors the comparator for any frequency deviation for a plurality of samples of the frequency deviation determinations. A controller varies the control voltage to vary the output frequency in a direction to eliminate any frequency deviation.

13 Claims, 4 Drawing Sheets a schematic-block diagram of one embodiment of
PHASE LOCK CONTROL SYSTEM FOR A VOLTAGE CONTROLLED OSCILLATOR

BACKGROUND OF THE INVENTION

1. Technical Field

The present invention is directed to the art of phase lock loop control systems for controlling the output frequency of a voltage controlled oscillator and, more particularly, to improvements in such a system.

2. Description of the Prior Art

Phase lock loop controlled oscillators are widely used in RF transmission applications for both radio and television broadcast applications. It is important that the output frequency of such an oscillator be maintained relatively constant during operation. It has been known in the art to synchronize the operation of such an oscillator with a global positioning system (GPS). Also, the oscillator frequency should be maintained constant even though the GPS system is temporarily down and the oscillator is in what is known as a flywheel condition. The output frequency of the oscillator should be maintained within a predefined frequency error margin. The flywheel time may be on the order of 30 minutes to 24 hours and the output frequency of the oscillator should be maintained within the frequency error margin desired. The output frequency of an oscillator for RF operation may be on the order of 10 MHz. The permitted frequency deviation may be on the order of less than 0.01 Hz. The output frequency of such an oscillator may vary because of such factors as variations in ambient temperature and supply voltage.

The oscillators involved may frequently employ an oven-based temperature control crystal oscillator (OCXO) device. Such oscillators have been synchronized with GPS time as is indicated by various patents in the prior art. These patents include, for example, the U.S. patent to Hitch et al. U.S. Pat. No. 5,861,842 and the U.S. patent application publication number U.S. 2007/0035345A1.

It is known to control such oscillators by employing phase lock loop controllers (which may include a proportional integral and differential controller, known as a PI or PID controller). Controllers that employ a fixed proportional gain or a fixed integral time constant may have difficulty performing the operation within the desired requirements for RF frequency operation.

SUMMARY OF THE INVENTION

In accordance with one aspect of the present invention, a phase lock control system is provided. This system includes a voltage controlled oscillator that produces a frequency signal exhibiting an output frequency that varies dependent upon the value of a control voltage applied thereto. A frequency deviation determining system is provided that employs a counter that is intermittently triggered ON for a fixed time by successive timing pulses received from a reference source. A comparator determines whether there is any frequency deviation of the output frequency relative to a preset frequency. An error filter monitors the comparator to determine the frequency deviation for a plurality of samples of the determinations. A controller varies the control voltage to vary the output frequency of the oscillator in a direction to eliminate any frequency deviation.

In accordance with a more limited aspect of the present invention, the voltage controlled oscillator is an oven controlled crystal oscillator (OCXO).

Still further in accordance with the present invention, the controller has multiple stage variations of the control voltage to achieve variations in the speed of reducing and frequency deviation.

In accordance with a still further aspect of the present invention, the multiple stage variations depend upon the value of any frequency deviation that is determined by the frequency deviation determining system.

In accordance with a still further aspect of the present invention, the multiple stage variations include a first response stage for quickly reducing any frequency deviations greater than the first predetermined number.

In accordance with a still further aspect of the present invention, the multiple stage variations include a second response stage for reducing a frequency deviation which is between that of the first predetermined level and a second predetermined level.

Still further in accordance with the present invention, the multiple stage variations include a third response stage for reducing any frequency deviation of a level which is less than that of the second predetermined level.

BRIEF DESCRIPTION OF THE DRAWINGS

The foregoing and other advantages of the invention will become more readily apparent to those skilled in the art to which the present invention relates upon consideration of the following description of the invention with reference to the accompanying drawings, wherein.

DESCRIPTION OF THE PREFERRED EMBODIMENT

Figure 1:
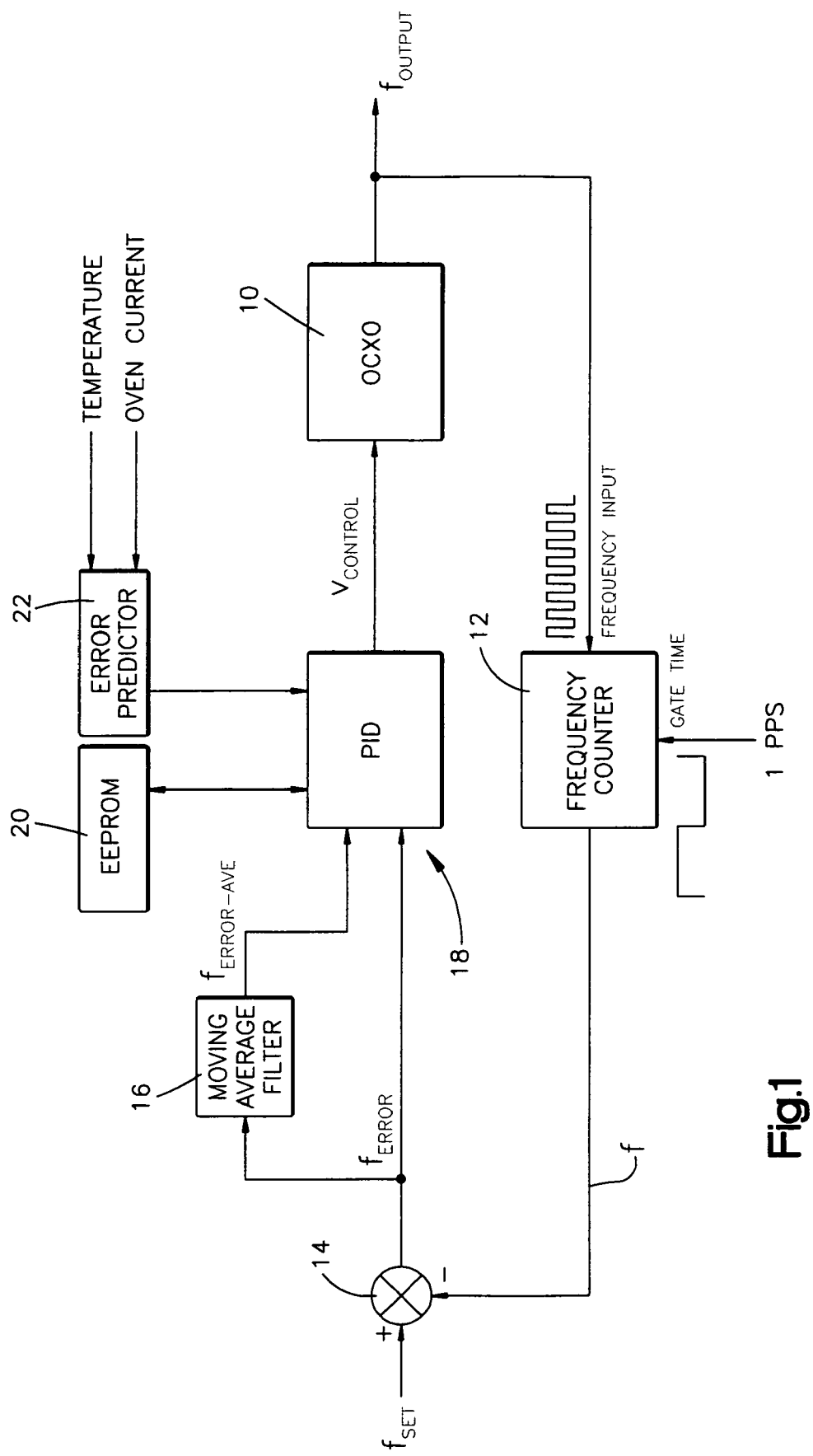
FIG. 1 is a schematic-block diagram of one embodiment of the present invention.

Reference is now made to the drawings and, more particularly, to FIG. 1 herein. In this preferred embodiment a phase lock control system is presented for controlling the output frequency $f_{output}$ of a voltage controlled oscillator 10. This oscillator 10 is preferably an oven based temperature controlled crystal oscillator (OCXO). The output frequency $f_{output}$ is dependent upon the magnitude of the control voltage $V_{control}$ applied to the oscillator 10. In a preferred version, the oscillator provides an output frequency signal exhibiting a frequency on the order of 10 MHz. A frequency deviation determining system is employed for determining whether the frequency of the output frequency from oscillator 10 deviates from a desired set frequency $f_{set}$. If so, the error is determined and a controller varies the control voltage $V_{control}$ that is applied to the oscillator 10 to vary the output frequency $f_{output}$ in a direction to eliminate any frequency deviation.

This frequency deviation determining system includes a frequency counter 12 that receives frequency input pulses obtained from the oscillator 10. This counter is enabled, or turned on, for one second at intervals based on a frequency source (preferably global positioning system (GPS)) operating at one PPS. These pulses serve to gate on the frequency counter and the pulses obtained from the oscillator 10 are counted. This provides a frequency count which is supplied to a comparator in the form of a summation device 14 that compares the frequency count with a set frequency $f_{set}$. If a difference takes place, then this difference is a frequency deviation or error signal $f_{error}$ and this is supplied to a moving average filter 16. This moving average filter may be looked upon as being an error filter. The filter monitors to see if there is any frequency deviation for a plurality of N samples of the deviation determinations. In a preferred version of the invention, 100 samples are taken to determine the average frequency deviation. This average frequency deviation may be referred to as frequency $f_{error-ave}$.

The outputs of the comparator 14 and the moving average filter 16 are supplied to a controller 18 that utilizes this information as well as that from a memory 20 and an error predictor 22 to vary the control voltage $V_{control}$. The controller 18 may take the form of a PID (proportional, integral and differential) controller, sometimes referred to as a PI controller, or, alternatively, may take the form of a typical programmed microcomputer or the like.

Figure 2:
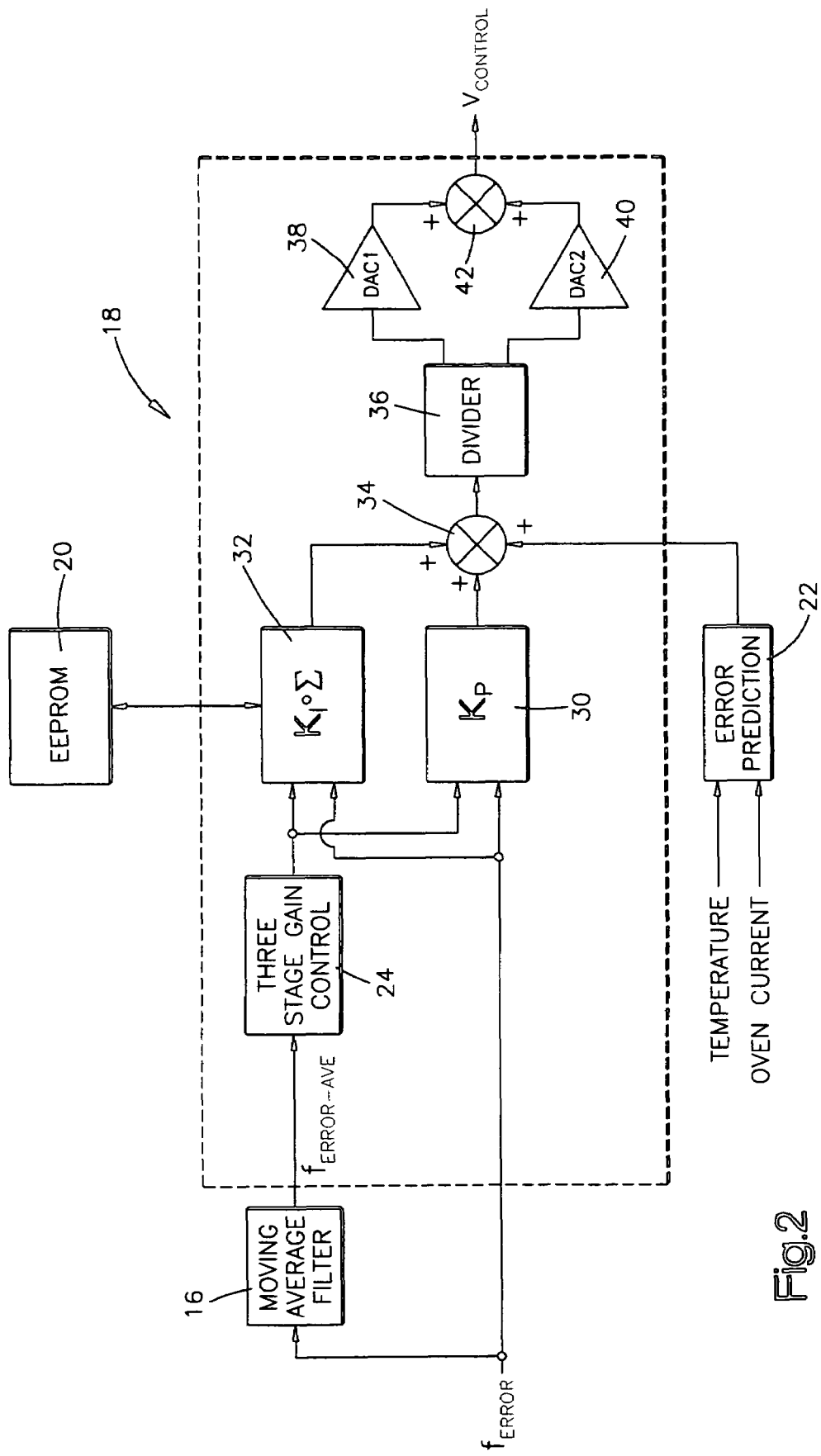
FIG. 2 is a schematic-block diagram illustration showing a portion of that illustrated in FIG. 1 but in greater detail.

The PID controller 18 may take the form as shown in FIG. 2. This controller serves as a loop filter with a three stage variable gain. This employs a three-stage gain controller 24 which receives the output from filter 16. This controller has a first stage, which is a fast response stage, a second stage, which is considered as a median speed stage, and a third stage, which is the finest tuning stage. These stages are discussed below.

The first stage is the fast response stage. In this stage, the PI controller 18 has a large proportional gain and a small integral time constant. The stage is used for correcting large frequency errors such as a big error from an AC restart. This is the stage that will be switched into and will be in control when the frequency error is greater than 1.0 Hz.

The second stage is the median speed stage wherein the PI controller has a median proportional gain and median integral time constant. This stage is used for correcting the moving average of a frequency error between 1.0 Hz and 0.1 Hz.

The third stage is the finest tuning stage. The PI controller has very small proportional gain and a very large integral time constant. This stage has the finest resolution for error correction and in this stage the PI controller is used for keeping the phase lock loop (PLL) locking with the GPS and the frequency error is at a minimum. To be in this stage, the moving average of the frequency error should be less than 0.1 Hz.

The outputs taken from the three stage gain controller 24 and the frequency $F_{error}$ signal are supplied to a proportional parameter unit 30 and an integral parameter unit 32 within the PID controller 18. The outputs of these units, together with that of the error prediction unit 22 are supplied to a summation device 34. The output taken from this summation device 34 is a digital multi-bit signal. This is divided by a divider 36 with the divided signals applied to a pair of 16 bit digital-to-analog converters (DAC1 and DAC2) which are referred to as converters 38 and 40. These are cascaded so as to provide greater resolution. The gains to the two DAC converters should be as the full scale of a DAC. The total resolution of two such cascaded DACs is on the order of 22 bits. The analog outputs of the two converters are supplied to a summation device 42 which then provides the analog voltage control signal $V_{control}$ to the oscillator 10.

The correction by the loop filter should be fast enough to correct frequency errors caused by ambient temperature and supply voltage variations. The PID controller should be fast enough to have the oscillator locked into the target frequency during a system start-up condition to put the system in normal operation within a predetermined short period of time, such as less than 10 minutes. The integral error that is noted by the controller is stored periodically in the memory 20.

Several advantages are obtained with the circuitry presented in FIGS. 1 and 2. The error moving average filter 16 resolves the lower resolution error detection for error condition monitoring. The phase lock loop is locked or not is determined by the output of the filter. The output of filter 16 is used as a rule to switch the control parameters for the PID 18. Also, the loop filter has three stage parameters which should resolve the requirements of a conflict between speed and accuracy. The storage of the control voltage in the memory presets the oscillator for an AC restart to reduce the locking time. The frequency variation prediction based on the temperature changing can be used to control the oscillator before the frequency appears to have the frequency variation reduced to a minimum level. Digital manipulation of the output of the loop filter allows it to fit any gain combination of the two DACs 38 and 40 to obtain higher resolution.

Figure 3A:
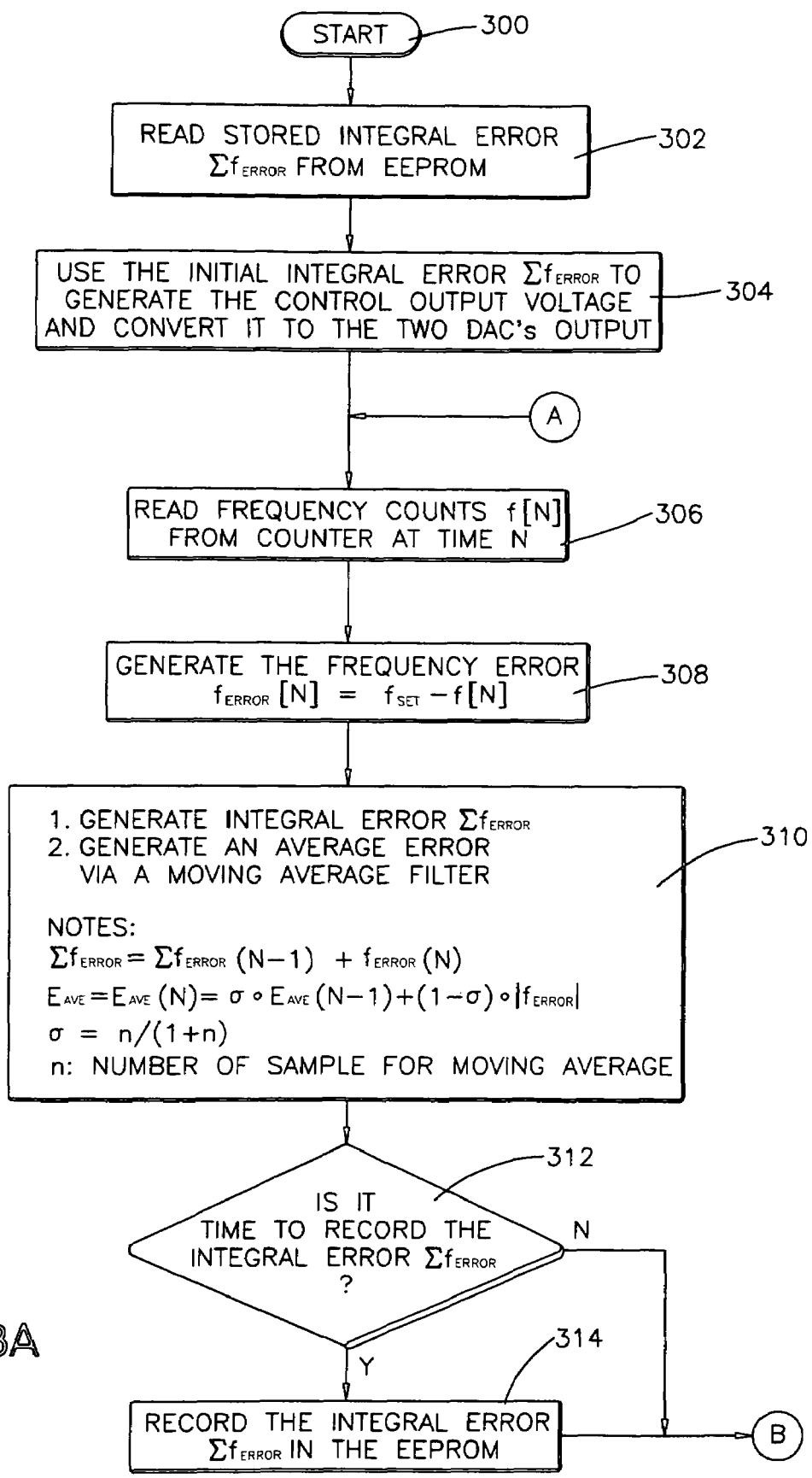
FIG. 3 is comprised of FIGS. 3A and 3B and illustrates a flow diagram of the operation herein.
Figure 3B:
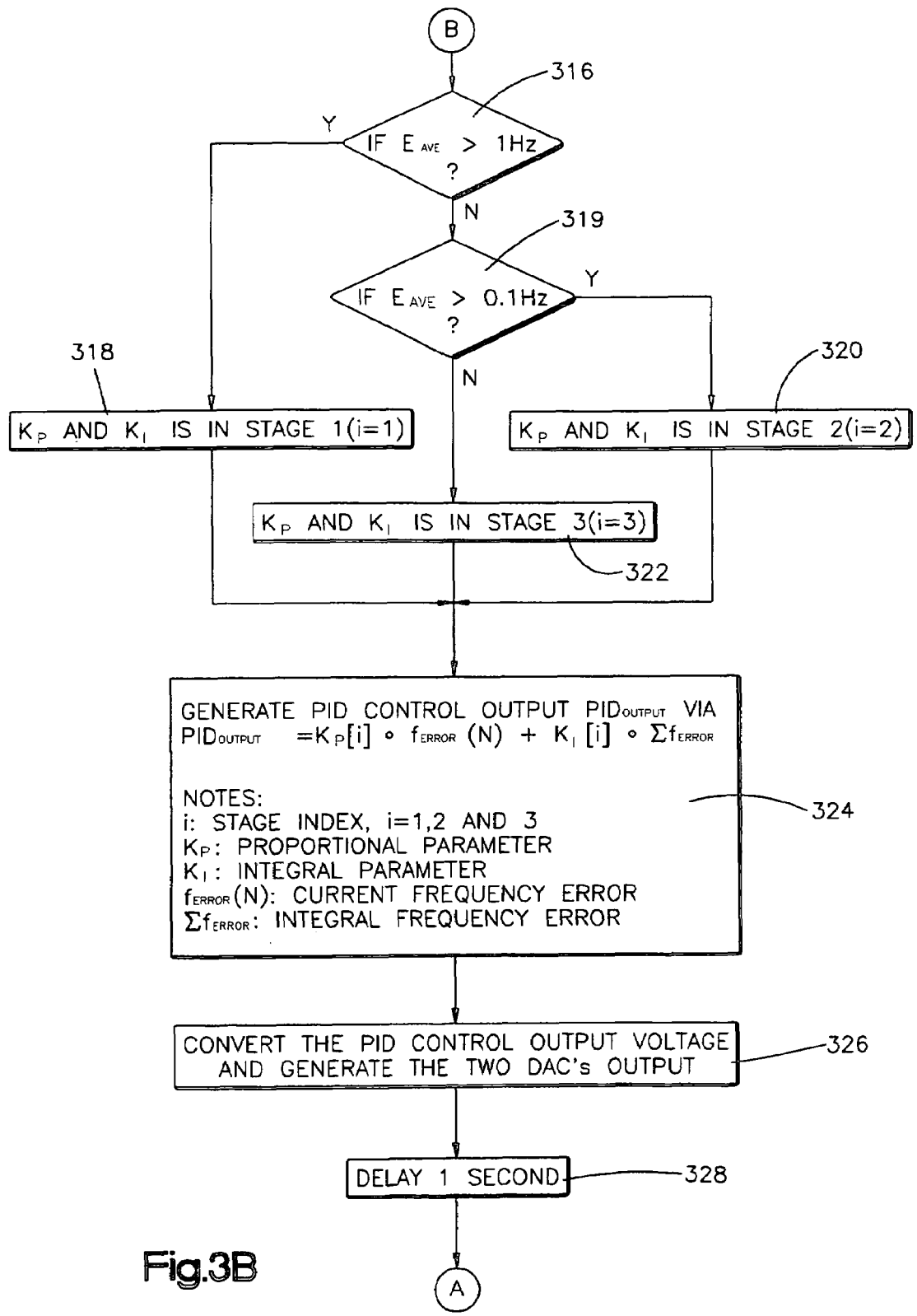

Reference is now made to the flowchart of FIGS. 3A and 3B. This represents the operation of the invention and may be employed for programming a computer to perform the operation or may be used as an explanation of the operations obtained by a system employing the PID controller 18. In this process, the operation commences at a START condition 300 and proceeds to a step 302, as is seen in FIG. 3A, during which the stored integral error $\Sigma f_{error}$ is obtained from the memory 20.

The procedure then advances to step 304 which is shown in the block of step 304 in FIG. 3A. The integral error $\Sigma f_{error}$ is employed to generate the control output voltage $v_{control}$.

The procedure advances to step 306 (after receiving any information from the flowchart of FIG. 3B to be described below). The procedure reads the frequency count from the counter 12 and advances to step 308. In step 308, it generates the frequency error $f_{error}$ (N) as is indicated in the block 308 of FIG. 3A.

The procedure then advances to step 310 at which it generates an integral error $\Sigma f_{error}$ and also generates an average error $E_{ave}$ by way of the moving average filter.

The procedure then advances to step 312 which is a determination step, during which it determines whether or not it is time to record the integral error in the memory 20. If so, it proceeds to step 314 at which the error is recorded.

Thereafter, if the determination is NO at step 312, or after the recording has taken place as in step 314, the procedure advances to step 316. This is a determination step to determine whether or not the $E_{ave}$ average is greater than 1 Hz. If it is, the procedure advances to step 318 during which the PID is set for stage 1 operation.

If the determination at step 316 is negative, the procedure advances to step 319 to determine if the $E_{ave}$ is greater than 0.1 Hz. If the answer is yes, then the procedure advances to step 320, at which the PID is set to Stage 2 operation.

If the determination at step 319 is a negative, then the procedure advances to step 322 at which the PID controller is advanced to the Stage 3 operation.

Thereafter, the procedure advances to step 324 to generate the PID control output as indicated in the block of step 324 in FIG. 3B.

The procedure then advances to step 326 at which the PID control output voltage is converted and generates the two DAC outputs for DACS 38 and 40. The procedure then advances to step 328 at which a delay period of one second is accomplished. Thereafter, the procedure repeats itself commencing with step 306 (see FIG. 3A).

To further facilitate an understanding of the invention, reference is made to Table I below.

TABLE I

| Stage | Switching Criteria | Proportional Parameter $K_p$ | Integral Parameter $K_1$ |
|---|---|---|---|
| 1 | $f_{ave} > 1.0$ Hz | 16348 | 8192 |
| 2 | 1.0 Hz > $f_{Ave}$ > 0.1 Hz | 8192 | 1024 |
| 3 | $f_{Ave} < 0.1$ Hz | 4096 | 128 |

It will be noted that this table provides the data showing the switching criteria to go from one stage to another based on the level of $F_{Ave}$.

Although the foregoing has been described in conjunction with the preferred embodiment, it is to be appreciated that various modifications may be made without departing from the spirit and scope of the invention as defined by the appended claims.

Having described the invention, we claim:

1. A phase lock control system for controlling the output frequency of a voltage controlled oscillator comprising:
    a voltage controlled oscillator that produces a frequency signal exhibiting an output frequency that varies dependent upon the value of a control voltage applied thereto;
    a frequency deviation determining system that employs a counter intermittently triggered ON for a fixed time by successive timing pulses received from a reference source and a comparator that determines any frequency deviation of said output frequency relative to a preset frequency;
    an error filter that monitors the comparator for any said frequency deviation for a plurality of samples of said frequency deviation determinations; and
    a controller that varies said control voltage to vary said output frequency in a direction to eliminate any said frequency deviation.

2. A system as set forth in claim 1 wherein said voltage controlled oscillator is an oven controlled crystal oscillator (OCXO).

3. A system as set forth in claim 1 wherein said reference source is a global positioning system (GPS).

4. A system as set forth in claim 3 wherein said voltage controlled oscillator is an oven-controlled crystal oscillator (OCXO).

5. A system as set forth in claim 1 wherein said error filter is a moving average filter.

6. A system as set forth in claim 5 wherein said voltage controlled oscillator is an oven-controlled crystal oscillator (OCXO).

7. A system as set forth in claim 6 wherein said reference source is a global positioning system (GPS).

8. A system as set forth in claim 3 wherein said error filter is a moving average filter.

9. A system as set forth in claim 1 wherein said controller includes multiple stage variations of said control voltage to achieve variations in the speed of reducing any said frequency deviation.

10. A system as set forth in claim 9 wherein said multiple stage variations of said control voltage are dependent upon the value of any said frequency deviation.

11. A system as set forth in claim 10 wherein said multiple stage variations includes a first response stage for quickly reducing any said frequency deviation greater than a first predetermined level.

12. A system as set forth in claim 11 wherein said multiple stage variations includes a second response stage for reducing any said frequency deviation which is of a level between that of said first predetermined level and a second predetermined level.

13. A system as set forth in claim 12 wherein said multiple stage variations includes a third response stage for reducing any said frequency deviation of a level which is less than that of said second predetermined level.

* * * * *